United States Patent
Slater, Jr. et al.

(10) Patent No.: US 7,402,837 B2
(45) Date of Patent: Jul. 22, 2008

(54) LIGHT EMITTING DEVICES WITH SELF ALIGNED OHMIC CONTACTS

(75) Inventors: David Beardsley Slater, Jr., Durham, NC (US); John Edmond, Cary, NC (US); Ian Hamilton, Youngsville, NC (US)

(73) Assignee: Cree, Inc., Durham, NC (US)

( * ) Notice: Subject to any disclaimer, the term of this patent is extended or adjusted under 35 U.S.C. 154(b) by 15 days.

(21) Appl. No.: 10/987,136

(22) Filed: Nov. 12, 2004

(65) Prior Publication Data

US 2005/0145869 A1    Jul. 7, 2005

Related U.S. Application Data

(60) Provisional application No. 60/519,425, filed on Nov. 12, 2003.

(51) Int. Cl.
*H01L 27/15* (2006.01)
(52) U.S. Cl. .......................... 257/91; 257/623
(58) Field of Classification Search ................ 257/81, 257/91, 95, 99, 623; 438/22, 24, 29, 978
See application file for complete search history.

(56) References Cited

U.S. PATENT DOCUMENTS

| | | | | |
|---|---|---|---|---|
| 4,064,620 A | * | 12/1977 | Lee et al. ................. | 438/122 |
| 4,680,085 A | * | 7/1987 | Vijan et al. .............. | 438/482 |
| 4,966,862 A | * | 10/1990 | Edmond .................. | 438/27 |
| 4,990,972 A | | 2/1991 | Satoh et al. | |
| 5,286,997 A | * | 2/1994 | Hill ........................... | 257/586 |
| 5,633,192 A | | 5/1997 | Moustakas et al. | |
| 5,939,735 A | * | 8/1999 | Tsutsui et al. ............ | 257/98 |
| 6,204,084 B1 | | 3/2001 | Sugiura et al. | |
| 6,204,512 B1 | * | 3/2001 | Nakamura et al. ....... | 257/13 |
| 6,404,125 B1 | | 6/2002 | Garbuzov et al. | |
| 6,547,249 B2 | * | 4/2003 | Collins et al. ............ | 257/88 |
| 6,610,995 B2 | * | 8/2003 | Nakamura et al. ....... | 257/13 |
| 6,740,906 B2 | * | 5/2004 | Slater et al. ............. | 257/99 |
| 6,894,317 B2 | * | 5/2005 | Nakajo .................... | 257/99 |
| 6,900,475 B2 | * | 5/2005 | Yokouchi et al. ........ | 257/99 |

FOREIGN PATENT DOCUMENTS

| | | |
|---|---|---|
| EP | 0 383 237 | 8/1990 |
| WO | WO 02/061847 | 8/2002 |

OTHER PUBLICATIONS

International Search Report and the Written Opinion of the International Searching Authority for application No. PCT/US2004/03828 mailed on Apr. 29, 2005.

* cited by examiner

*Primary Examiner*—Thao X. Le
*Assistant Examiner*—Ajay K Arora
(74) *Attorney, Agent, or Firm*—Myers Bigel Sibley & Sajovec, PA

(57) ABSTRACT

Methods of fabricating light emitting diodes and light emitting devices are provided that include a substrate, an n-type epitaxial region on the substrate and a p-type epitaxial region on the n-type epitaxial region. At least a portion of the p-type epitaxial region comprises a mesa with respect to the substrate. An ohmic contact is provided on an exposed portion of the p-type epitaxial layer. The ohmic contact is self aligned to a sidewall of the mesa and to the p-type epitaxial layer such that a sidewall of the ohmic contact is substantially aligned with a sidewall of the mesa and to the p-type epitaxial layer.

11 Claims, 4 Drawing Sheets

LIGHT EMITTING DEVICES WITH SELF ALIGNED OHMIC CONTACTS

RELATED APPLICATION AND CLAIM OF PRIORITY

The present application is related to and claims priority from U.S. Provisional Patent Application Ser. No. 60/519,425, filed Nov. 12, 2003 and entitled "LED WITH SELF ALIGNED OHMIC CONTACT," the disclosure of which is incorporated herein as if set forth in its entirety.

BACKGROUND OF THE INVENTION

1. Field of the Invention

The present invention relates to semiconductor devices, and more particularly to light emitting devices having an ohmic contact formed on an epitaxial layer.

2. Description of the Related Art

Light emitting diodes (or LEDs) are well known solid state electronic devices capable of generating light upon application of a sufficient voltage. Light emitting diodes generally comprise a p-n junction formed in an epitaxial layer deposited on a substrate such as sapphire, silicon, silicon carbide, gallium arsenide and the like. The wavelength distribution of the light generated by the LED depends on the material from which the p-n junction is fabricated and the structure of the thin epitaxial layers that comprise the active region of the device.

Commonly, an LED includes an n-type substrate, an n-type epitaxial region formed on the substrate and a p-type epitaxial region formed on the n-type epitaxial region. In order to facilitate the application of a voltage to the device, an anode ohmic contact is formed on a p-type region of the device (typically, an exposed p-type epitaxial layer) and a cathode ohmic contact must be formed on an n-type region of the device (such as the substrate or an exposed n-type epitaxial layer).

Because it is difficult to make highly conductive p-type Group III-nitride, materials (such as GaN, AlGaN, InGaN, AlInGaN, and AlInN), lack of current spreading in the p-type layer may be a limiting factor in the performance of LEDs formed from such materials. Accordingly, it is desirable to form an ohmic contact over as much of the surface area of the exposed p-type layer as possible in order to induce current to pass through as much of the active region of the device as possible. Moreover, patterning an ohmic contact conventionally requires at least one photolithography step. Photolithography may be an expensive and time consuming step in the semiconductor device fabrication process. It is desirable to reduce the number of photolithography steps required for device fabrication.

SUMMARY OF THE INVENTION

In some embodiments, a light emitting diode includes a substrate and an epitaxial region formed on the substrate. The epitaxial region includes an n-type epitaxial region formed on the substrate and a p-type epitaxial region formed on the n-type epitaxial region. At least a portion of the epitaxial region including surface portions of the p-type epitaxial region are formed in the shape of a mesa. An ohmic contact is formed on exposed portions of the p-type epitaxial layer. The ohmic contact is self aligned to the mesa and to the p-type epitaxial layer. The sidewalls of the mesa may be semi-insulating for protection of the p-n junction to discourage degradation and failure of the device.

Method embodiments of the invention include forming an epitaxial region on a substrate including an n-type region and a p-type region; forming an ohmic contact on exposed portions of the p-type epitaxial layer; applying an etch mask to portions of the ohmic contact; etching through exposed portions of the ohmic contact; with the mask in place, continuing etching through exposed portions of the epitaxial region to form a mesa; and removing the etch mask. The sidewalls of the mesa may be implanted with ions in a manner that causes the surface of the sidewalls to become semi-insulating.

Further embodiments of the present invention provide light emitting devices that include a substrate, an n-type epitaxial region on the substrate and a p-type epitaxial region on the n-type epitaxial region. At least a portion of the p-type epitaxial region comprises a mesa with respect to the substrate. An ohmic contact is provided on an exposed portion of the p-type epitaxial layer. The ohmic contact is self aligned to a sidewall of the mesa and to the p-type epitaxial layer such that a sidewall of the ohmic contact is substantially aligned with a sidewall of the mesa and to the p-type epitaxial layer.

In some embodiments of the present invention, a sidewall of the mesa is configured such that a portion of the substrate extends beyond the sidewall of the mesa. A portion of the p-type epitaxial region and/or the n-type epitaxial region of the mesa adjacent the sidewall of the mesa may be semi-insulating.

In further embodiments of the present invention, the mesa has a sidewall extending through the p-type epitaxial region. The mesa may have a sidewall extending through the p-type epitaxial region and into the n-type epitaxial region. The mesa may also have a sidewall extending through the p-type epitaxial region and the n-type epitaxial region. The mesa may have a sidewall extending to the substrate.

In particular embodiments, the light emitting device is a light emitting diode. The light emitting device could also be a laser diode.

In further embodiments of the present invention, the p-type epitaxial region comprises a Group III-nitride epitaxial layer and the n-type epitaxial region comprises a Group III-nitride epitaxial layer. The substrate may be a SiC substrate or a sapphire substrate. The ohmic contact include platinum.

In still further embodiments of the present invention, methods of fabricating a light emitting device include forming an n-type epitaxial layer on a substrate, forming a p-type epitaxial layer on the n-type epitaxial layer, forming an ohmic contact layer on exposed portions of the p-type epitaxial layer, etching through exposed portions of the ohmic contact layer to provide a patterned ohmic contact and etching into the p-type epitaxial layer using the patterned ohmic contact as a mask to form a mesa.

Further embodiments of the present invention include applying an etch mask to portions of the ohmic contact layer. In such embodiments, etching through exposed portions of the ohmic contact layer includes etching through the ohmic contact layer using the etch mask. The etch mask may also be removed.

In additional embodiments of the present invention, etching into the p-type epitaxial layer includes etching into the p-type epitaxial layer using the etch mask on the ohmic contact layer as a mask and removing the etch mask is preceded by etching into the p-type epitaxial layer.

In some embodiments of the present invention, etching into the p-type epitaxial layer includes etching into the p-type epitaxial layer using the etch mask such that a sidewall of the mesa is configured such that a portion of the substrate extends beyond the sidewall of the mesa.

Additional embodiments of the present invention include ion implanting the sidewall of the mesa such that a portion of the p-type epitaxial layer of the mesa adjacent the sidewall of the mesa is made semi-insulating.

In yet other embodiments of the present invention, etching into the p-type epitaxial layer includes etching through the p-type epitaxial layer such that a sidewalls extends through the p-type epitaxial layer. Etching into the p-type epitaxial layer may also include etching through the p-type epitaxial layer and into the n-type epitaxial layer such that a sidewall of the mesa extends through the p-type epitaxial layer and into the n-type epitaxial layer. Etching into the p-type epitaxial layer could also include etching through the p-type epitaxial layer and the n-type epitaxial layer such that a sidewall of the mesa extends through the p-type epitaxial layer and the n-type epitaxial layer. Etching into the p-type epitaxial layer could include etching through the p-type epitaxial layer and the n-type epitaxial layer such that a sidewall of the mesa extends through the p-type epitaxial layer and the n-type epitaxial layer and to the substrate.

DETAILED DESCRIPTION

Figure 1A:
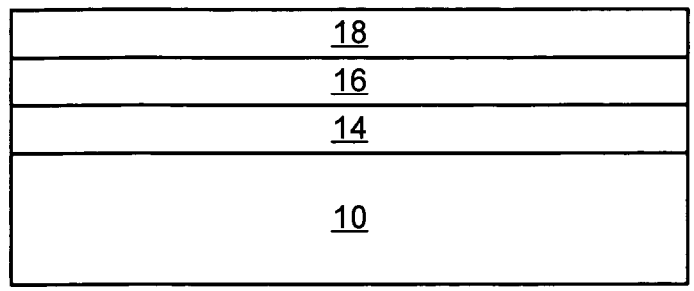
FIGS. 1A-1F illustrate conventional methods of forming an ohmic contact.

The present invention now will be described more fully hereinafter with reference to the accompanying drawings, in which embodiments of the invention are shown. This invention should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, while the present invention is described with respect to semiconductor wafers and diced chips, such chips may be diced into arbitrary sizes. Accordingly, the present invention is not limited to the relative size and spacing illustrated in the accompanying figures. In addition, certain features of the drawings are illustrated in exaggerated dimensions for clarity of drawing and ease of explanation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Although various embodiments of LEDs disclosed herein include a substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The invention described herein is not limited to structures having crystalline epitaxial growth substrates and may be utilized in connection with structures in which the epitaxial layers have been removed from their original growth substrates and bonded to substitute carrier substrates.

Embodiments of the invention now will be described, generally with reference to gallium nitride-based light emitting diodes on silicon carbide-based substrates. However, it will be understood by those having skill in the art that many embodiments of the invention may be employed with many different combinations of substrate and epitaxial layers. For example, combinations can include AlGaInP diodes on GaP substrates; InGaAs diodes on GaAs substrates; AlGaAs diodes on GaAs substrates; SiC diode on SiC or sapphire (Al2O3) substrate; and/or a nitride-based diodes on gallium nitride, silicon carbide, aluminum nitride, sapphire, zinc oxide and/or other substrates.

GaN-based light emitting diodes (LEDs) typically comprise an insulating or semiconducting substrate such as SiC or sapphire on which a plurality of GaN-based epitaxial layers are deposited. The epitaxial layers comprise an active region having a p-n junction that emits light when energized.

FIG. 1A schematically illustrates a precursor structure for an LED device having an n-type SiC substrate 10, an active region comprising an n-GaN-based layer 14 and a p-GaN-based layer 16 grown on the substrate. An ohmic contact 18 is formed on the p-GaN layer 16. Ohmic contact layer 18 may comprise a thin (<100 ★) layer of platinum deposited by evaporation. Formation of ohmic contacts on gallium nitride layers is described for example in U.S. Patent Application Publication Number 2003/0025121 entitled "Robust Group III Light Emitting Diode for High Reliability in Standard Packaging Applications" which is assigned to the assignee of the present invention and which is incorporated herein by reference as if fully set forth herein.

Figure 1B:
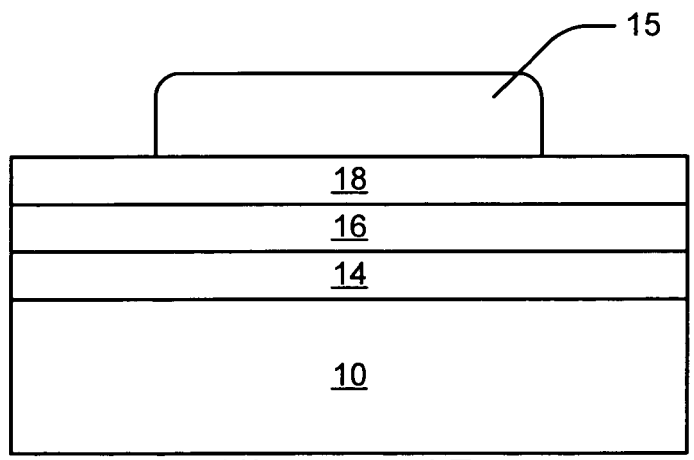

In order to pattern the ohmic contact, an etch mask 15 may be formed on the ohmic contact layer 18 as illustrated in FIG. 1B. Etch mask 15 may comprise photoresist or any suitable material which resists etching by a chlorine-based dry etch. In one such process, after formation of ohmic contact 18, a layer of photoresist is applied to the top surface of the device. The photoresist is selectively exposed using a mask and exposed portions of the photoresist are developed out (i.e. removed) to leave a portion of the photoresist on the upper surface of the ohmic contact layer 18 to act as an etch mask.

Figure 1C:
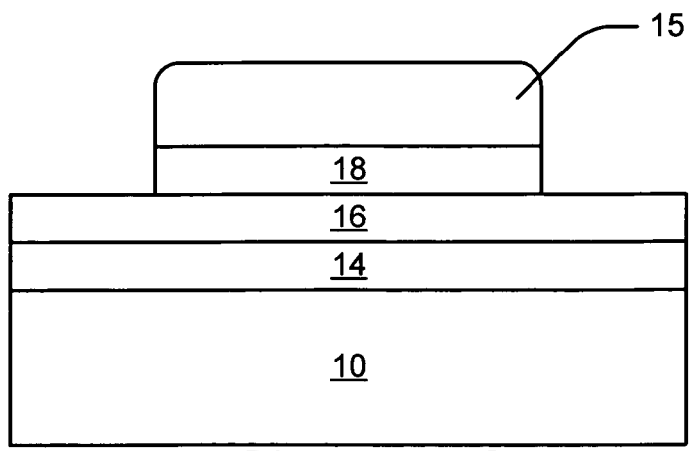
Figure 1D:
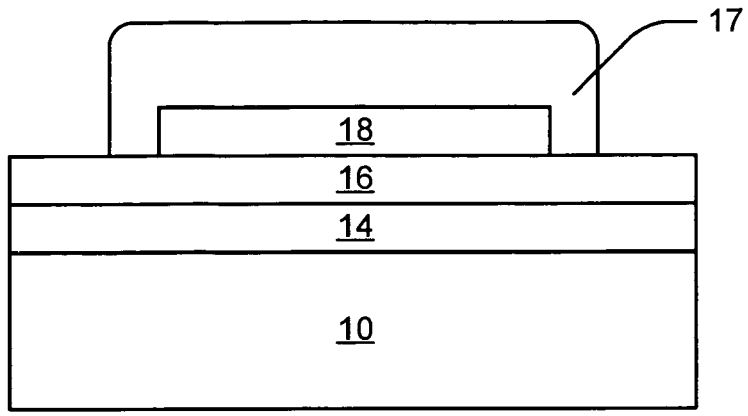

Next, as illustrated in FIG. 1C, exposed portions of the ohmic contact layer are etched away using a chlorine-based dry etch. Dry etching using a chlorine-based etchant is described in U.S. Pat. No. 5,631,190 which is assigned to the assignee of the present invention and is incorporated herein by reference.

Figure 1E:
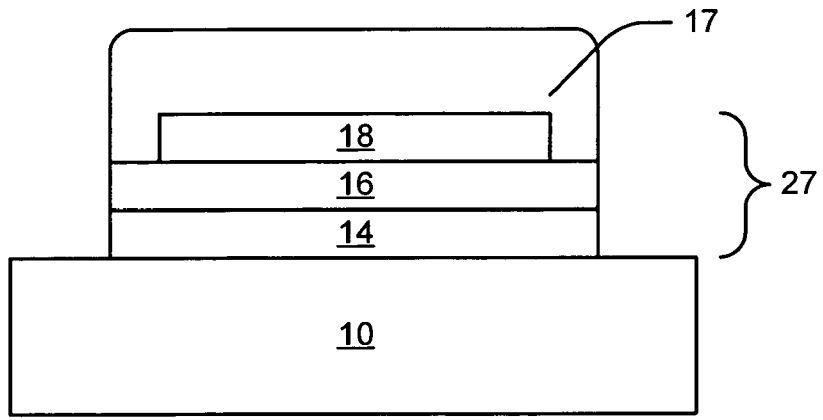
Figure 1F:
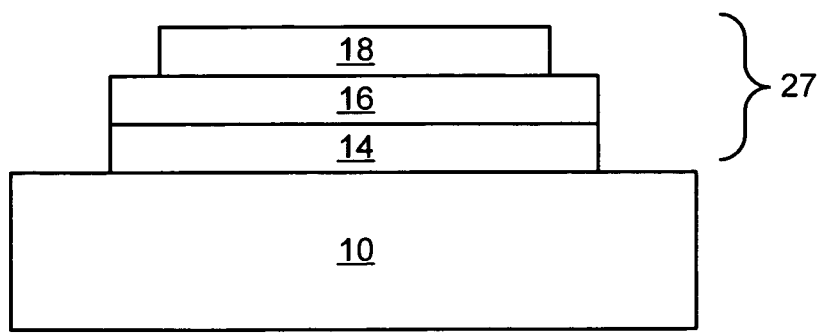

After etching for a sufficient time to remove exposed portions of the ohmic contact, the etch mask 15 is optionally removed and a second etch mask 17 is formed over ohmic contact 18 and also over exposed portions of p-type layer 16. Due to the width tolerance of the photolithographic process, etch mask 17 may overlap the ohmic contact by about 1-2 μm or more. As illustrated in FIG. 1E, the p-type layer 16 and n-type layer 14 are then etched (using a chlorine-based dry etch in some embodiments) to reveal a portion of the surface of substrate 10. The etch mask 17 is then removed as illustrated in FIG. 1F. If the etch mask is a photoresist, it may be removed through immersion in a solvent such as acetone or a stripper such as N-methylpyrolidinone.

A bond pad (not shown) may be formed on the ohmic contact 18 and a passivation layer (not shown) may be formed over the upper surface of the device. The passivation layer may comprise a dielectric material such silicon nitride or silicon dioxide and may be deposited using a conventional method such as PECVD deposition or sputtering. Methods of forming passivation layers are described in detail in the aforementioned U.S. Patent Application Publication No. 2003/0025121.

Photolithography steps such as those described above are expensive and time consuming, since they require multiple steps and precise alignment of a mask to a wafer.

Figure 2A:
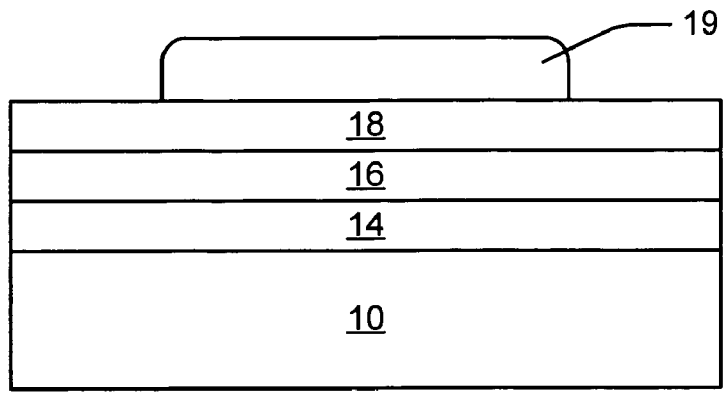
FIGS. 2A-C illustrate methods of forming an ohmic contact according to embodiments of the invention.
Figure 2B:
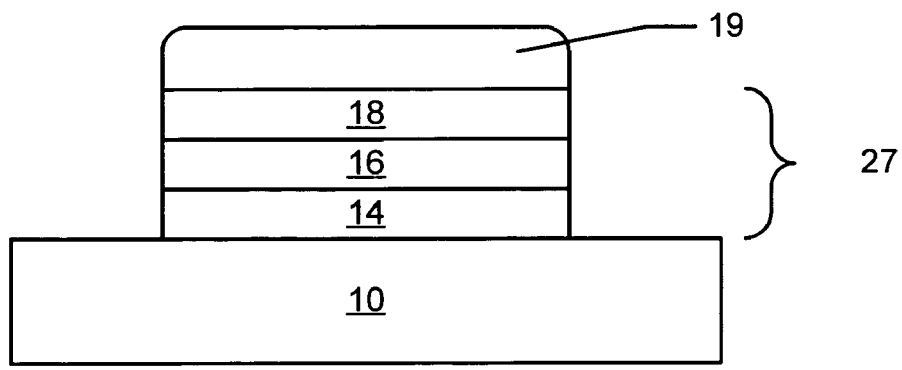
Figure 2C:
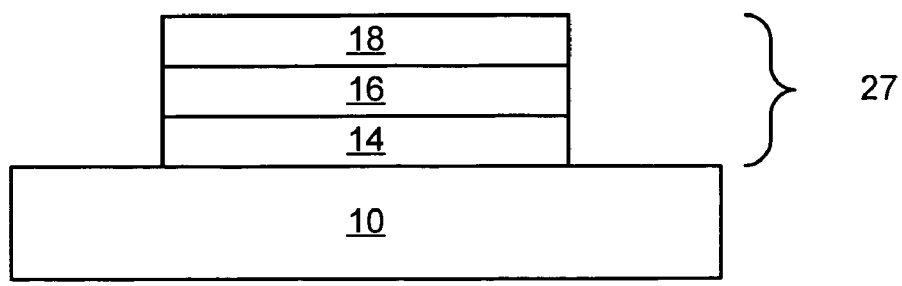

Embodiments of the invention which use a reduced number of photolithography steps are illustrated in FIGS. 2A-2C. In these embodiments, an etch mask 19 is formed on portions of the surface of ohmic contact layer 18 as illustrated in FIG. 2A. Next, as shown in FIG. 2B, the ohmic contact layer 18 is etched along with p-type epitaxial layer 16 and, in some embodiments, the n-type epitaxial layer 14, to expose portions of the surface of substrate 10 and form mesa 27. Thus, a mesa is formed having a sidewall that extends into the p-type epitaxial layer 16. In some embodiments, the etch is performed until the sidewall of the mesa extends through the p-type epitaxial layer 16 and, in some embodiments, into the n-type epitaxial layer 14. In further embodiments, the etch is performed until the sidewall of the mesa extends through the p-type epitaxial layer 16 and through the n-type epitaxial layer 14. In some embodiments, the etch is performed until the sidewall extends to and/or into the substrate 10. In some embodiments, the etch extends into but not through the substrate, thus maintaining a mesa with respect to the substrate.

In some embodiments, etching is performed using a chlorine-based dry etch as described above for a sufficient time to remove both the exposed ohmic contact metal 18 as well as the Group III-nitride based epitaxial layers. As shown in FIG. 2C, the etch mask is then removed.

Although substrate 10 is SiC in the illustrated embodiment, substrate 10 may comprise any other suitable substrate material such as sapphire, silicon, gallium arsenide and the like.

A blanket passivation layer (not shown) may be formed over the exposed upper surfaces of the device. The passivation layer may comprise a dielectric material such silicon nitride or silicon dioxide and may be applied by known methods such as PECVD or sputter deposition.

In order to protect the p-n junction, prior to removal of the mesa etch mask 19, the exposed surfaces of the mesa may be implanted with ions to render the surfaces semi-insulating. Methods of ion implantation are disclosed in U.S. patent application Ser. No. 10/987,627 entitled "Led Fabrication Via Ion Implant Isolation," Slater et al. inventors, filed concurrently herewith, which is incorporated herein by reference as if fully set forth fully herein.

In preferred methods of ion implantation, the wafer is tilted and ions are implanted into the sidewalls of the mesa. Since the wafer is tilted during implantation, the implanted ions strike the sides of the mesa at a relatively steep angle. Since the entire sidewall is implanted at once, multiple implants are not required. Also, the dose and depth of the implant may be reduced. As a result, the volume of the implanted region is reduced, thereby reducing light absorption within the implanted region. The implant depth may be 0.1-0.2 μm. The wafer may be rotated during the implant for uniformity. In one embodiment, the wafer is rotated 8 times during implantation. The implant dose may be $2\times10^{13}$ cm$^{-2}$ N+ at 60 keV at a 60 degree angle. Rotating the wafer reduces the implant dose by a factor of 4 for square mesas. Thus, an implant dose of $2\times10^{13}$ cm$^{-2}$ actually results in a dose of $5\times10^{12}$ cm$^{-2}$ per side for a four-sided mesa structure.

Figure 3:
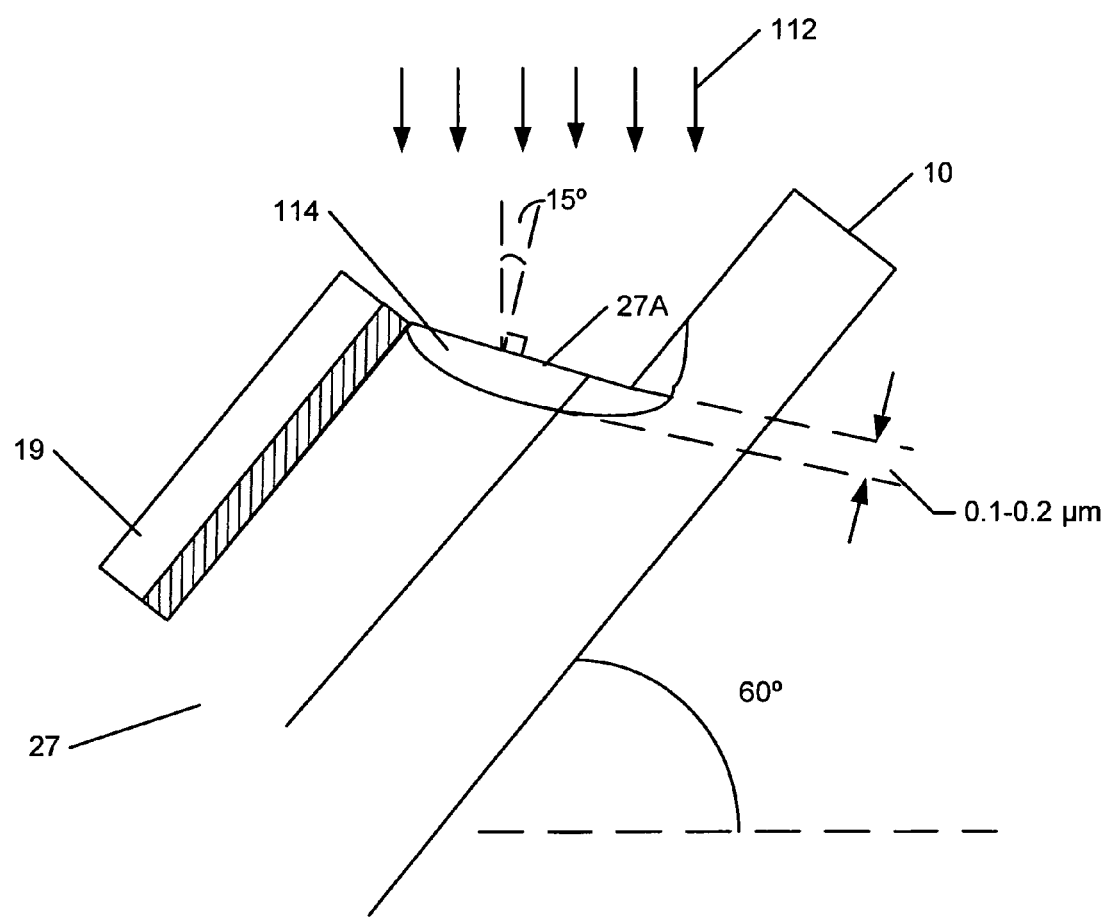
FIG. 3 is a cross-sectional drawing illustrating implantation of ions into the sidewalls of a mesa.

Turning to FIG. 3, after growth of the epitaxial layers on the substrate and mesa formation (for simplicity, only one mesa 27 is illustrated in FIG. 3.) the substrate 10 is mounted on a tiltable, rotatable wafer carrier (not shown) and placed in an ion implanter. The wafer carrier is tilted to make the sidewalls 27A of the mesas 27 as close to horizontal as possible (i.e. as close as possible to perpendicular to the implant direction). In one embodiment, the wafer carrier is tilted by at least 45° and preferably by 60° such that the implant direction is less about 25° from a direction normal to the mesa sidewall 27A. In the illustrated embodiment, the mesa makes an angle of about 105° with the substrate, resulting in an implant angle of about 15° from normal. Ions 112 are then implanted into the mesa sidewall to form an implanted region 114 which extends approximately 0.1-0.2 μm into the mesa sidewall 27A. As discussed above, the wafer carrier may be rotated one time or a plurality of times during implantation for uniformity. By implanting the sidewalls 27A of the mesas 27, only a single implant may be required to effectively render regions of the sidewalls 27A semi-insulating.

While embodiments of the present invention have been described with reference to light emitting diodes (LEDs), some embodiments of the present invention may be utilized with other light emitting devices, such a laser diodes. Accordingly, the term light emitting device is used herein to refer to devices that emit light in the visible or non-visible spectrum and the light may be coherent or incoherent.

Furthermore, while embodiments of the present invention have been described with reference to the etch mask 19 being used for a single etch step, other embodiments of the present invention may use multiple etch steps with either the etch mask 19 or the patterned ohmic contact layer 18 as a mask. Such may be case, for example, if a second etch step is used where the etchant utilized has etch selectivity with respect to the ohmic contact material and the underlying epitaxial layers. In such a case a self aligned structure that provides a mesa with a sidewall that is substantially aligned (i.e. not differing by substantially more than results from differences in lateral etch rate) with the sidewall of the ohmic contact may be provided with only a single application and patterning of the etch mask 19.

In the drawings and specification, there have been disclosed embodiments of the invention and, although specific terms are employed, they are used in a generic and descriptive sense only and not for purposes of limitation, the scope of the invention being set forth in the following claims.

That which is claimed is:

1. A light emitting device, comprising:
   a substrate;
   an n-type epitaxial region on the substrate;
   a p-type epitaxial region on the n-type epitaxial region, at least a portion of the p-type epitaxial region comprising a mesa with respect to the substrate, wherein the mesa has opposing sidewalls extending completely through the p-type epitaxial region, and wherein portions of the p-type epitaxial region adjacent the opposing sidewalls of the mesa have an increased resistance relative to other portions thereof;
   an ohmic contact on an exposed portion of the p-type epitaxial region, wherein opposing sidewalls of the ohmic contact are substantially aligned with the opposing sidewalls of the mesa and to the p-type epitaxial region.

2. The light emitting device of claim 1, wherein a sidewall of the mesa is configured such that a portion of the substrate extends beyond the sidewall of the mesa.

3. The light emitting device of claim 1, wherein the opposing sidewalls of the mesa extend completely through the n-type epitaxial region, and wherein portions of the n-type epitaxial region of the mesa adjacent the opposing sidewalls of the mesa have an increased resistance relative to other portions thereof.

4. The light emitting device of claim 3, wherein the mesa has a sidewall extending to the substrate.

5. The light emitting device of claim 1, wherein the light emitting device comprises a light emitting diode.

6. The light emitting device of claim 1, wherein the light emitting device comprises a laser diode.

7. The light emitting device of claim 1, wherein the p-type epitaxial region comprises a Group III-nitride epitaxial layer and the n-type epitaxial region comprises a Group III-nitride epitaxial layer.

8. The light emitting device of claim 7, wherein the substrate comprises a SiC substrate.

9. The light emitting device of claim 7, wherein the substrate comprises a sapphire substrate.

10. The light emitting device of claim 7, wherein the ohmic contact comprises platinum.

11. The light emitting device of claim 1, further comprising:
   a mask on the ohmic contact opposite the p-type epitaxial region, wherein opposing sidewalls of the mask are substantially aligned with opposing sidewalls of the ohmic contact and with the opposing sidewalls of the mesa.

* * * * *